(12) United States Patent
Fitchett et al.

(10) Patent No.: US 6,993,693 B2
(45) Date of Patent: Jan. 31, 2006

(54) ANALOGUE/DIGITAL INTERFACE CIRCUIT

(75) Inventors: Michael Fitchett, Fenouillet (FR); Jan Krellner, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 432 days.

(21) Appl. No.: 10/363,773

(22) PCT Filed: Sep. 10, 2001

(86) PCT No.: PCT/EP01/10450

§ 371 (c)(1),
(2), (4) Date: Mar. 7, 2003

(87) PCT Pub. No.: WO02/21148

PCT Pub. Date: Mar. 14, 2002

(65) Prior Publication Data

US 2004/0100301 A1    May 27, 2004

(30) Foreign Application Priority Data

Sep. 11, 2000 (EP) .................................. 00402493

(51) Int. Cl.
G01R 31/28 (2006.01)
H03M 1/12 (2006.01)

(52) U.S. Cl. ..................... 714/724; 714/716; 341/155

(58) Field of Classification Search ............... 714/716, 714/717, 724, 726, 727, 731, 734, 798; 341/155, 341/163, 126, 110
See application file for complete search history.

(56) References Cited

U.S. PATENT DOCUMENTS

| 4,393,461 | A | | 7/1983 | Holtey et al. |
| 4,504,960 | A | | 3/1985 | Yamada |
| 5,406,216 | A | | 4/1995 | Millman et al. |
| 5,574,731 | A | | 11/1996 | Qureshi |
| 5,712,633 | A | * | 1/1998 | Bae ........................... 341/120 |
| 5,847,561 | A | * | 12/1998 | Whetsel .................... 324/158.1 |
| 2001/0049806 | A1 | * | 12/2001 | Porteners et al. ........... 714/724 |

FOREIGN PATENT DOCUMENTS

JP      09097164      4/1997

* cited by examiner

Primary Examiner—Christine T. Tu

(57) ABSTRACT

An analogue/digital interface circuit is disclosed in which an integral bistable circuit has its state changed by the arrival of an incoming analogue signal, however transient, and irrespective of when it arrives relative to the clock signal driving the digital circuit. The use of a bistable (flip-flop) circuit enables each parth of the interface circuit to be traversed when scan test signals are applied to it. Concurrently with the application of such signals, an inhibition signal is applied to the analogue signal inlet to prevent the arrival of any subsequency analogue signals from changing the state of the signal-storage element.

3 Claims, 2 Drawing Sheets

ANALOGUE/DIGITAL INTERFACE CIRCUIT

FIELD OF INVENTION

This invention relates to analogue/digital interface circuits, particularly for connection between the analogue and digital components of a mixed-signal circuit.

BACKGROUND OF INVENTION

In analogue circuits, an outlet signal may be produced at any time. However, digital circuits are normally driven at a chosen frequency, by means of so-called 'clock' signals. If an analogue circuit or device to which a digital circuit is connected generates a short-term ephemeral signal during the interval between two clock signals, the latter circuit will not respond to the analogue signal. This problem has been solved in the past by causing the arrival of an analogue signal of any duration to set a 'flag', by changing the state of an associated latch forming part of the analogue circuit. When the latch becomes set, this signal is passed to all the relevant downstream components of the digital circuit. The latter is designed to send a 'latch-reset' signal back to the latch after the latch signal has been processed.

However, this known system has the significant disadvantage that each path to be traversed by the latch and latch-reset signals must be able to be tested using mixed-signal tests. This is so complex that it is not possible to simplify the testing procedure by using automatic test pattern generation.

PRIOR ART

U.S. Pat. No. 5,574,731 (National Semiconductor Corp) describes a set/reset scan flip-flop. The scan signal is selected as multiplexer output when a test mode is selected. A D-flip-flop is included with additional asynchronous input (s), as well as a scan-multiplexer and a logic gate. However, the set/reset signal uses a scan test, thus the signal Test Enable gates both the multiplexer and an OR gate. The asynchronous, analogue event, which causes the flop-flop to be set, must not be erroneously or prematurely flagged.

U.S. Pat. No. 5,406,216 (Motorola) describes an RS latch for use in asynchronous circuitry. 'Q' and SCANOUT signals are the same in a preferred embodiment of the invention. A NAND gate acts as a multiplexer. The object of the latch is to convert an asynchronous digital circuit into a synchronous testable circuit. Digital control of signals S and R is assumed and required.

Accordingly, the present invention aims at providing an analogue/digital (A/D) interface circuit of which each path may be tested by automatic application of suitable test signals.

SUMMARY OF INVENTION

The present invention provides an A/D interface circuit which is as claimed in the appended claims.

BRIEF DESCRIPTION OF DRAWINGS

The present invention will now be described by way of example with reference to the accompanying drawings, in which.

DETAILED DESCRIPTION

In the following description, components in different Figures retain the references given originally.

Figure 1:
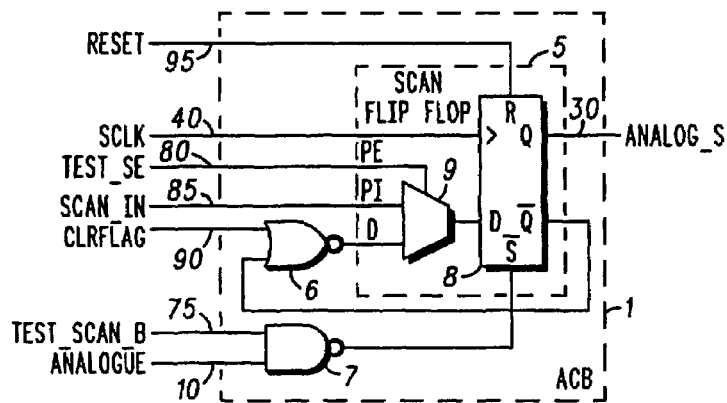
FIG. 1 is a schematic of an integrated interface circuit of this invention.

As shown in FIG. 1, the bistable component of the interface circuit 1 for generating 'flag' signals takes the form of a sub-circuit 5 comprising a flip-flop 8 to which are applied a gated analogue signal on line 10; a clock signal (sclk) on line 40, and a reset signal on line 95. Associated with the flip-flop 8 is a multiplexer 9 having as inputs a shift-enable test (test_se) signal on line 80 to inlet PE, a scan test (scan_in) signal on line 85 to inlet PI, and a gated clear flag (clrflag) signal on line 90 to inlet D. The latter signal is gated by a NOR gate 6 having as its other input the output from the barQ outlet of flip-flop 8. The analogue signal on line 10 is gated by a NAND gate 7 having as its other input a disable analogue input (test_scan_b) signal on line 75. When this latter signal is not applied to the interface circuit, the arrival of a transient analogue signal at the interface applies a signal to inlet barS on flip-flop 8, causing it to change its state and thus generate a 'flag' signal. When a clock signal arrives at flip-flop 8 in its 'flag-raised' state, a signal (analogues) appears at outlet Q on line 30. In its 'flag-lowered' state, the equivalent signal appears at the outlet barQ and is applied to gate 6, resulting in the application of a signal to inlet D of the flip-flop 8 only when signal 'clrflag' appears on line 90.

Full-scan testability of the interface circuit is achieved by the selective application of the signals 'test_se' and 'scan_in' to it, combined with the concurrent application of signal 'test_scan_b' to the NAND gate 7.

Figure 2:
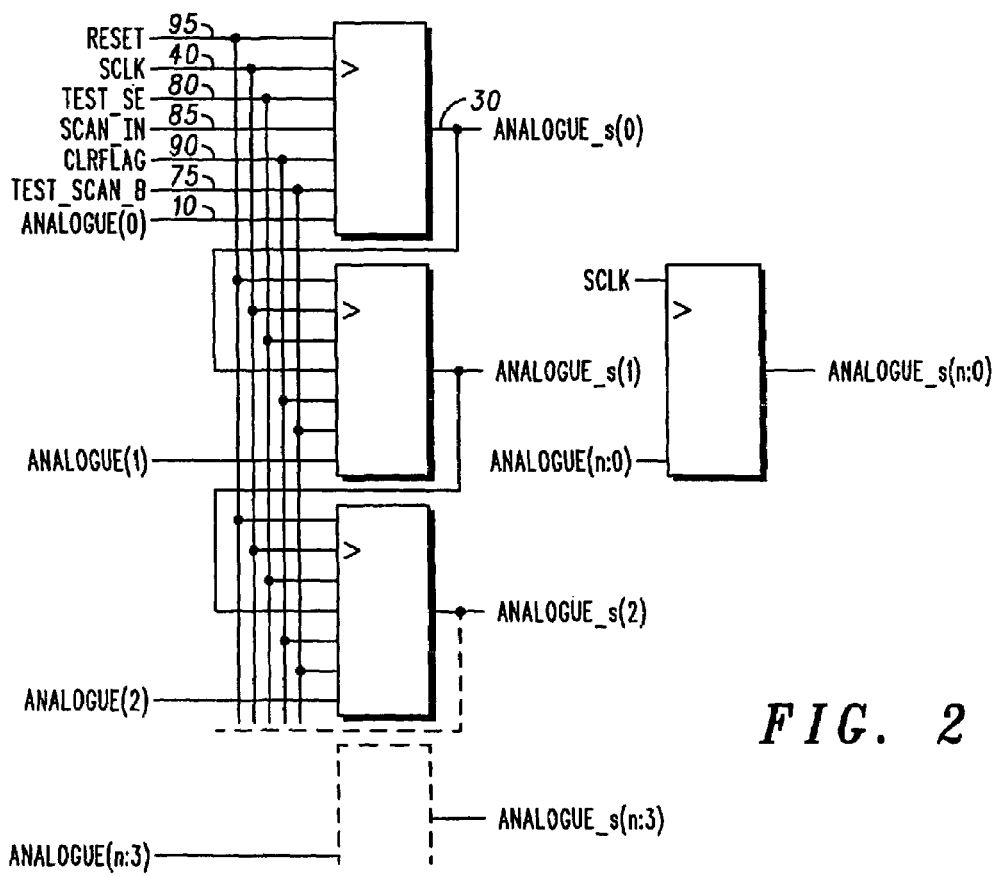
FIG. 2 is a schematic of an array of the circuits shown in FIG. 1 to accommodate the arrival of N analogue signals.

In the array of FIG. 2, each of the interface circuits of FIG. 1 has its respective inlets connected in parallel to the various signal sources. Instead of each such circuit supplying its own analogue output signal (analogue_s) to the downstream digital circuit (s), there is only one output signal (analogue_s(n)), where (n+1) is the number of input analogue signals. There is the 'scan$_{13}$ in' signal input to the first circuit in the array, and what would have been the 'analogue_s' output is cascaded to the next circuit in the array, where it functions as the 'analogue_s(0)' input to the multiplexer 9. The said next circuit has its own analogue input 'analogue(1)', causing this part of the array to generate the output signal 'analogue_s(1)'. This output is in turn cascaded to the next block in the array, et seq, giving rise to the eventual combined output signal 'analogue_s(n)', where (n+1) is the number of blocks. FIG. 2 also shows how the multi-block array may be alternatively represented, so that a single clock signal 'sclk' to the array, plus several analogue signals applied at the various inlets gives rise to several analogue output signals 'analogue_s(n:0)'.

Figure 3:
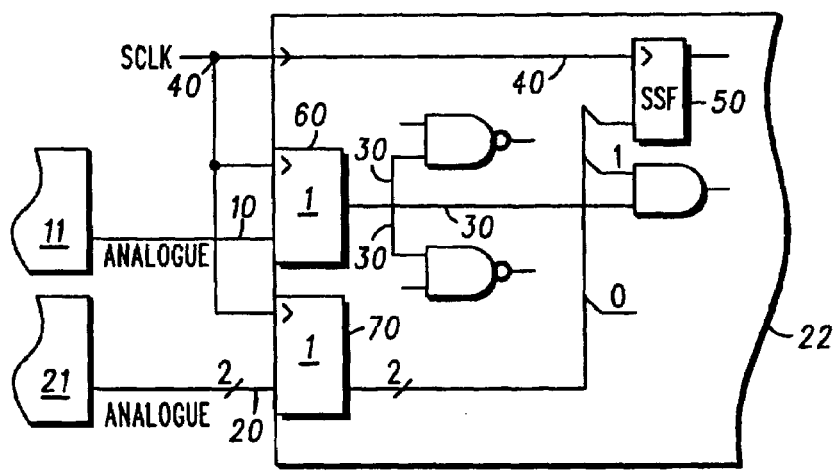
FIG. 3 is a schematic of two interface circuits of this invention positioned between two analogue circuits and an integrated digital circuit.

In FIG. 3, two representative sources 11 and 21 of analogue signals are interconnected to two interface circuits 1 acting as inlets to a composite synchronous digital circuit 22. It will be seen that one input signal passes along a line 10, whereas the other input signal passes along a bus 20. The nature of the digital circuit 22 is not relevant to this invention, and so will not be discussed herein in any further detail.

Figure 4:
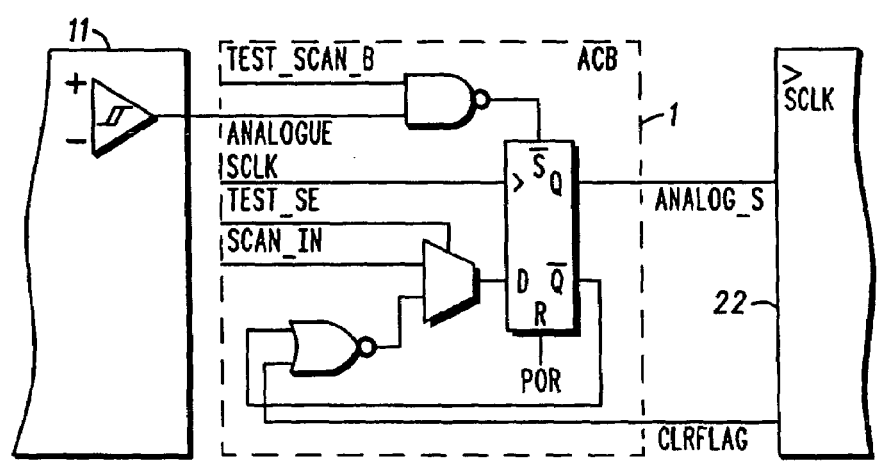
FIG. 4 is a schematic of a modified form of the FIG. 1 circuit positioned between an analogue and a digital circuit.

Similar considerations apply to FIG. 4, in which a single analogue circuit 11 applies its output to interface circuit 1, which supplies its output to an inlet of digital circuit 22, from which the incoming analogue signal 'analogue_s' is fanned out to the various components of the digital circuit. By means which are not shown, the circuit 22 supplies as output a 'clrflag' signal which acts as the input to the NOR gate of circuit 1. By this means, the digital circuit acknowledges that it has received an input signal by changing the state of the bistable circuit of interface circuit 1, effectively to lower the flag.

Thus it will be seen that the present invention provides an analogue/digital interface circuit in which a transient analogue input signal is captured, irrespective of when in arrives relative to the clock signal driving the digital circuit, and one in which the nature of the signal storage element is such as to allow all paths in the interface circuit to be traversed by test signals generated by standard scan test technologies.

What is claimed is:

1. An interface circuit comprising:

a scan flip-flop having a clock input for receiving a clock signal, a data input, a set input, and a first output terminal and a second output terminal, the first output terminal providing an output signal for use by a digital circuit that is also clocked by the clock signal;

a first logic gate having a first input for receiving an analogue input signal, a second input for receiving a first test signal, and an output connected to the set input of the scan flip-flop;

a second logic gate having a first input connected to the second output terminal of the scan flip-flop, a second input for receiving a clear signal, and an output; and a multiplexer having a first input connected to the output of the second logic gate, a second input connected to a second test signal, a control input connected to a test control signal and an output connected to the data input of the scan flip-flop, the scan flip-flop having a state at the first output terminal and second output terminal which is changed by arrival of the analogue input signal irrespective of when the analogue input signal arrives relative to the clock signal.

2. The interface circuit of claim 1 wherein the first logic gate is a NAND gate.

3. The interface circuit of claim 1 wherein the second logic gate is an OR gate.

* * * * *